(12) United States Patent
Wickboldt

(10) Patent No.: US 11,594,069 B1
(45) Date of Patent: Feb. 28, 2023

(54) ANTI-SPOOFING OPTICAL FINGERPRINT SENSOR METHODS AND HARDWARE WITH COLOR SELECTION

(71) Applicant: OmniVision Technologies, Inc., Santa Clara, CA (US)

(72) Inventor: Paul Wickboldt, Walnut Creek, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 17/469,565

(22) Filed: Sep. 8, 2021

(51) Int. Cl.
*G06V 40/12* (2022.01)
*H01L 27/146* (2006.01)
*G06V 40/13* (2022.01)

(52) U.S. Cl.
CPC ...... *G06V 40/1394* (2022.01); *G06V 40/1318* (2022.01); *H01L 27/14621* (2013.01); *H01L 27/14645* (2013.01)

(58) Field of Classification Search
CPC .......... G06V 40/1318; H01L 27/14621; H01L 27/14645
See application file for complete search history.

(56) References Cited

U.S. PATENT DOCUMENTS

| | | | |
|---|---|---|---|
| 10,102,411 B2 | 10/2018 | Lillie et al. | |
| 10,438,046 B2 | 10/2019 | He et al. | |
| 11,018,173 B2 * | 5/2021 | Kim | H01L 27/14621 |
| 11,039,056 B2 * | 6/2021 | Kang | H01L 27/14627 |
| 11,056,519 B2 * | 7/2021 | Inui | H01L 27/1463 |
| 11,056,523 B2 * | 7/2021 | Park | H01L 27/14623 |
| 11,074,467 B2 * | 7/2021 | He | G06V 40/1318 |
| 11,217,617 B2 * | 1/2022 | Akiyama | H01L 27/14685 |
| 11,297,271 B2 * | 4/2022 | Wakashima | H01L 27/14627 |
| 11,328,150 B2 * | 5/2022 | Fan | G06V 40/1318 |
| 11,348,376 B2 * | 5/2022 | Park | G06V 40/40 |
| 11,372,248 B2 * | 6/2022 | Calafiore | G02B 6/28 |
| 11,404,455 B2 * | 8/2022 | Nakata | H01L 27/14605 |
| 11,410,412 B2 * | 8/2022 | Yang | G06V 10/56 |
| 11,450,138 B2 * | 9/2022 | Nilsson | H01L 27/14627 |
| 11,455,826 B2 * | 9/2022 | Zhong | G06V 40/1365 |

(Continued)

OTHER PUBLICATIONS

U.S. Appl. No. 17/469,508 Notice of Allowance dated Sep. 14, 2022, 12 pages.

(Continued)

*Primary Examiner* — Vinh T Lam
(74) *Attorney, Agent, or Firm* — Lathrop GPM LLP

(57) ABSTRACT

An optical fingerprint sensor with spoof detection includes a plurality of lenses; a pixel array including a plurality of first photodiodes, a line between a center of each first photodiode and an optical center of each lens forms an optical axis; at least one apertured baffle-layer positioned between the image sensor and the plurality of lenses, each having a respective plurality of aperture stops, each aperture stop being center-aligned with the optical axis; and a plurality of second photodiodes intercalated with the plurality of first photodiodes; and a color filter layer between the pixel array and the plurality of lenses, said color filter layer includes a plurality of color filters positioned such that each second photodiode is configured to detect electromagnetic energy having passed through lens, a color filter, and at least one aperture stop not aligned along the optical axis.

20 Claims, 6 Drawing Sheets

(56) References Cited

U.S. PATENT DOCUMENTS

| | | | |
|---|---|---|---|
| 11,468,705 B1* | 10/2022 | Liao | G06V 40/1347 |
| 11,475,706 B2* | 10/2022 | Li | G06V 40/1365 |
| 2006/0202028 A1 | 9/2006 | Rowe et al. | |
| 2008/0192988 A1 | 8/2008 | Uludag et al. | |
| 2015/0078636 A1 | 3/2015 | Carver et al. | |
| 2017/0161540 A1 | 6/2017 | Mienko et al. | |
| 2021/0195127 A1* | 6/2021 | Ishiwata | H01L 27/14612 |
| 2022/0181372 A1* | 6/2022 | Lee | H01L 27/14621 |
| 2022/0231095 A1* | 7/2022 | Erickson | H01L 27/3213 |
| 2022/0276163 A1* | 9/2022 | Cheung | G01N 21/53 |
| 2022/0277509 A1* | 9/2022 | Mundus | G06T 15/06 |
| 2022/0307967 A1* | 9/2022 | Kiselev | G01N 1/00 |

OTHER PUBLICATIONS

U.S. Appl. No. 17/469,461, filed Sep. 8, 2021, Paul Wickboldt.
U.S. Appl. No. 17/469,473, filed Sep. 8, 2021, Paul Wickboldt.
U.S. Appl. No. 17/469,565, filed Sep. 8, 2021, Paul Wickboldt.
U.S. Appl. No. 17/469,508, filed Sep. 8, 2021, Paul Wickboldt.

* cited by examiner

600

602
ILLUMINATE A FINGERPRINT SAMPLE WITH LIGHT FROM A DISPLAY, THE PLURALITY OF ANTI-SPOOFING PHOTODIODES AND THE PLURALITY OF IMAGING PHOTODIODES POSITIONED UNDERNEATH A GLASS OF THE DISPLAY.

604
ILLUMINATE THE FINGERPRINT SAMPLE WITH A NON-UNIFORM PATTERN OF ILLUMINATION.

610
DETECT LARGE-ANGLE LIGHT INCIDENT ON A PLURALITY OF ANTI-SPOOF PHOTODIODES OF A PIXEL ARRAY AFTER PASSING THROUGH A COLOR FILTER.

630
DETECT SMALL-ANGLE LIGHT INCIDENT ON THE PLURALITY IMAGING PHOTODIODES OF THE PIXEL ARRAY.

632
DETERMINING THE ANGULAR DISTRIBUTION OF ELECTROMAGNETIC ENERGY BASED ON THE SMALL-ANGLE LIGHT DETECTED.

634
PREVENT LARGER-ANGLE LIGHT FROM STRIKING THE PLURALITY OF IMAGING PHOTODIODES WITH AT LEAST ONE APERTURED BAFFLE-LAYERS.

636
DIRECT SMALL-ANGLE LIGHT WITH A PLURALITY OF LENSES, EACH LENS DIRECTING SMALL-ANGLE LIGHT TOWARD ONE IMAGING PHOTODIODE OF THE PLURALITY OF IMAGING PHOTODIODES.

660
DETERMINE AN ANGULAR DISTRIBUTION OF ELECTROMAGNETIC ENERGY BASED AT LEAST IN PART ON THE DETECTED LARGE-ANGLE LIGHT.

670
DETECT SPOOF FINGERPRINTS BASED AT LEAST IN PART ON THE ANGULAR DISTRIBUTION AND SPECTRAL INFORMATION OF ELECTROMAGNETIC ENERGY.

672
APPLY AT LEAST ONE ANTI-SPOOF ALGORITHM TO DETECTED LARGE-ANGLE LIGHT.

FIG 6

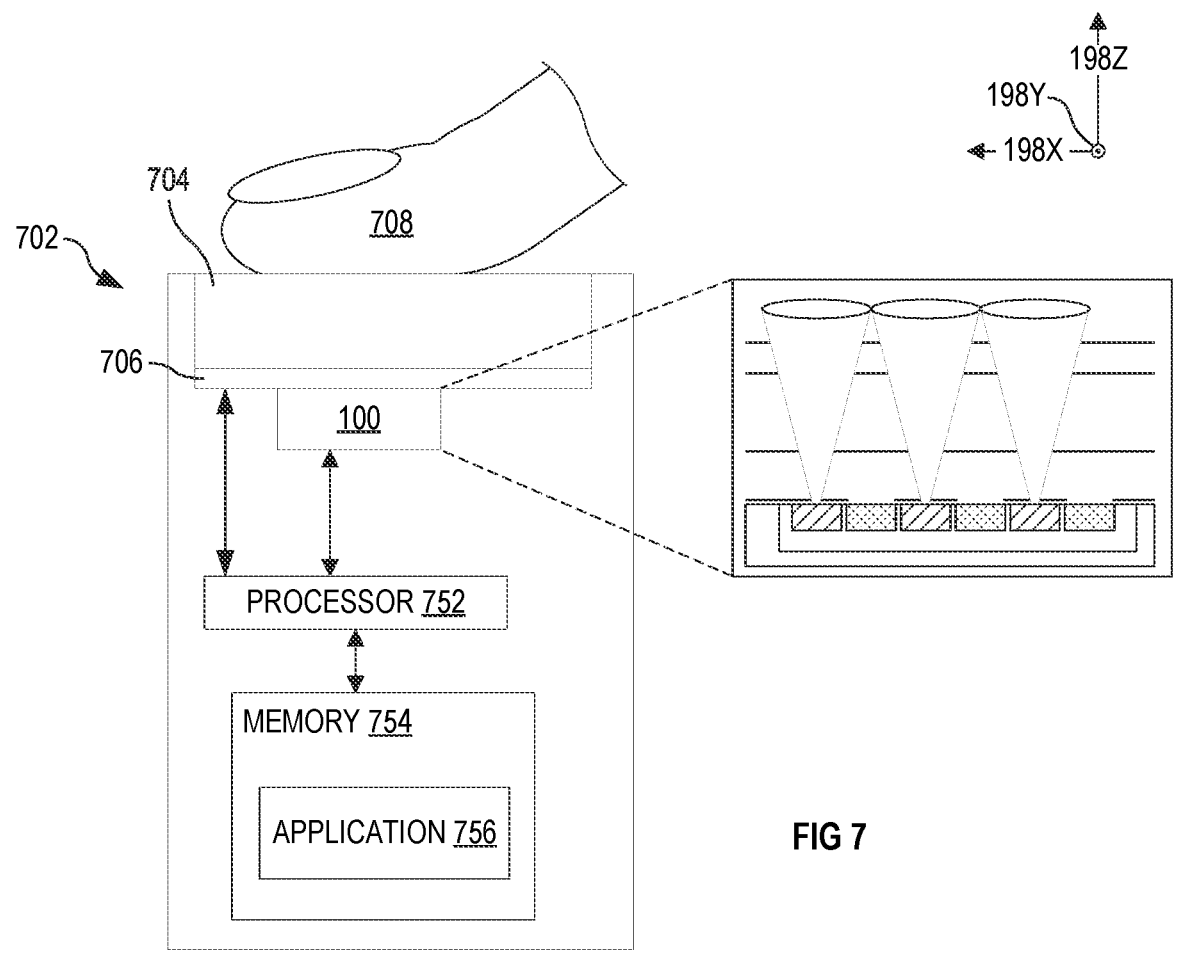

ANTI-SPOOFING OPTICAL FINGERPRINT SENSOR METHODS AND HARDWARE WITH COLOR SELECTION

BACKGROUND

Fingerprint sensing is becoming an increasingly common tool for authorizing (a) access to electronic devices, such as smartphones, (b) access to confidential electronic records, and (c) electronic transactions such as financial transactions carried out over the Internet. Fingerprint sensing satisfies market demand for an authentication mechanism that eliminates the need to enter (and remember) a passcode, and also eliminates the need to keep track of multiple different passcodes associated with different devices and/or accounts. Fingerprint sensing is a well-established form of biometric identification and optical fingerprint sensors have been used for years, e.g., by law enforcement agencies.

Several different types of fingerprint sensors have been designed for use in smartphones and other mobile devices. Each of these types of fingerprint sensors images a finger to obtain the fingerprint. A camera-based fingerprint scanner captures an image of a fingerprint using an imaging lens and an image sensor. A collimator-based fingerprint scanner senses a fingerprint with a lens array aligned over an image sensor with the addition of a collimator above the image sensor. The collimator helps map light from a specific region of the fingerprint sample to be detected by a corresponding region of the image sensor by forming channels the light must propagate through to reach the image sensor.

One issue with fingerprint image sensing is the possibility of generating fake, or spoof, fingerprints that trick the fingerprint sensor in order to gain access to a device. Spoof fingerprints can be fabricated in a range of ways including printing an image of the fingerprint on paper and forming molded objects that reproduce the desired fingerprint pattern. If created with sufficiently high resolution and fidelity to the real fingerprint, these spoofing methods can trick fingerprint sensors and allow unauthorized access to devices and accounts. Fingerprint sensors based on image sensors struggle to distinguish real fingerprints from spoof fingerprints, thereby making fingerprint sensors a less reliable authentication method.

SUMMARY OF THE INVENTION

Collimator-based fingerprint sensors narrow the acceptable paths that electromagnetic energy may travel between the fingerprint sample and the image sensor. In some instances, they do so by forming channels or cones that transmit electromagnetic energy but block incoming electromagnetic energy with angles and positions not within this intended path. This allows electromagnetic energy from a specific region of the fingerprint sample to reach only the region of the image sensor intended to image that region of the fingerprint and reduces electromagnetic energy from any other region of the fingerprint sample from reaching that region of the image sensor. This can be accomplished in several ways including an array of apertured baffle-layers positioned between a lens array and the image sensor. Each apertured baffle-layer has apertures aligned above each pixel of the image sensor, with the width of each aperture configured to transmit only a narrow cone of acceptable angles of incoming electromagnetic energy. This design has been used to help improve image quality and performance of under-screen fingerprint sensors. The term "light" and the term "electromagnetic energy" are used interchangeable herein. Electromagnetic energy herein refers to electromagnetic energy with wavelength between 0.4 and 2 microns.

Techniques exist to overcome fingerprint sensors and gain unauthorized access to devices and information including creating spoof fingerprints. Spoof fingerprints include printed images of fingerprints and molded objects that reproduce the three-dimensional structure of the target fingerprint sample. Current techniques to detect spoof fingerprints largely rely on reviewing real and spoof fingerprints and using algorithms to detect the differences in the images generated of each by the fingerprint sensor. As spoof fingerprints are made with higher resolution and fidelity, the images they produce on the fingerprint sensor become challenging to distinguish from real fingerprint samples. Using only the image generated limits spoof detection and leaves fingerprint sensors vulnerable to high-quality, high-resolution spoof fingerprint attacks.

When printed or molded spoof fingerprint samples are used on fingerprint sensors, the material properties of the sample play a role in how electromagnetic energy interacts between the sample and the fingerprint sensor. This can be exploited to increase spoof detection. Within the glass of the fingerprint sensor, electromagnetic energy is scattered from the sample with a range of outgoing angles. This distribution of scattered electromagnetic energy depends on the material being sampled. Human fingers, printed images, and molded objects may produce the same image on the image sensor but they produce different angular distributions of reflected and scattered electromagnetic energy. A fingerprint sensor capable of detecting this angular distribution has superior ability to detect spoofs than one which only records an image of the sample.

Detecting the angular distribution of electromagnetic energy is possible by exploiting the physical design of an apertured baffle-layer collimator that may be used in an optical fingerprint sensor. By design, electromagnetic energy with a small angle of incidence, which is to say with a small angular divergence from the surface normal of the image sensor, is transmitted through the collimator to a pixel of the image sensor corresponding to a physical location on the fingerprint sample from which the electromagnetic energy originated. These pixels of the image sensor are called imaging pixels, herein. Generally, an imaging pixel is aligned with at least one aperture and a given lens along a line roughly parallel to the surface normal of the image sensor. Electromagnetic energy traveling toward the fingerprint sensor with sufficiently large angle of incidence may traverse through a given lens and then through apertures not aligned with that lens, after which it may be incident on image sensor between adjacent imaging pixels. This light is generally not useful for imaging the fingerprint sample and is thus disregarded. In the embodiments described herein, electromagnetic energy with large angle of incidence, so called large-angle light, is detected and used to measure the veracity of a fingerprint sample. Additionally, color filters may be incorporated in the collimator such that large-angle light passes through the color filters but small angle light does not. By detecting large-angle light and associated information provided by the color filters, the fingerprint sensor records additional information about the sample that can be used to confirm whether a sample is a real finger or a spoof finger.

When employing algorithms to detect spoof fingerprints, the additional information provided by detecting large-angle light may also be inputted into the algorithms for enhanced spoof-detection accuracy. This is especially valuable with the use of machine learning algorithms, which automatically compare differences between training sets. Variations in angular distributions that are caused by material properties of the sample will be available to machine learning algorithms, which will be able to identify spoof fingerprints based on combination of image details and angular distribution.

In an embodiment, an optical fingerprint sensor with spoof detection includes a plurality of lenses Lm=0, L1, . . . LJ−1 with a lens pitch along a horizontal direction that is orthogonal to a lens axis of lens L0, each lens having a width; an image sensor including a pixel array that includes a plurality of first photodiodes Im=0, I1, . . . IJ−1 with a first photodiode pitch that is equal to the lens pitch in the horizontal direction, a line between a center of a light-sensitive surface of each first photodiode Im and an optical center of each lens Lm forms an optical axis Om of a plurality of optical axes Om=0, O1, . . . OJ−1; at least one apertured baffle-layer positioned between the image sensor and the plurality of lenses, each of the at least one apertured baffle-layer located at a respective height zk above the pixel array and each having a respective plurality of aperture stops Am=0, A1, . . . AJ−1, each aperture stop Am being center-aligned with the optical axis Om; and a plurality of second photodiodes Sm=0, S1, SK−1 that is included in the pixel array, the plurality of second photodiodes is intercalated with the plurality of first photodiodes such that a second photodiode Sm is between first photodiode Im and first photodiode Im+1 in the horizontal direction; and a color filter layer between the image sensor and the plurality of lenses, said color filter layer includes a plurality of color filters positioned in the path of electromagnetic energy detected by one of the plurality of second photodiodes but not one of the plurality of first photodiodes, wherein each second photodiode is configured to detect electromagnetic energy having passed through lens Lm, a color filter, and at least one aperture stop Ax≠m not aligned with Lm along optical axis Om.

In an embodiment, a method for detecting spoof fingerprints detected using an optical fingerprint sensor includes detecting large-angle light incident on a plurality of anti-spoof photodiodes of a pixel array after it passes through a color filter, large-angle light being electromagnetic energy with incident angle greater than five degrees from an optical axis of each anti-spoof photodiode of the plurality of anti-spoof photodiodes; wherein the plurality of anti-spoof photodiodes is interleaved with a plurality of imaging photodiodes such that each anti-spoof photodiode of the plurality of anti-spoof photodiodes is between adjacent imaging photodiodes of the plurality of imaging photodiodes; determining an angular distribution of electromagnetic energy based at least in part on the detected large-angle light; and detecting spoof fingerprints based at least in part on the angular distribution and spectral information of electromagnetic energy.

BRIEF DESCRIPTION OF THE FIGURES

FIG. 6 is a flowchart illustrating a method for detecting spoof fingerprints using a plurality of anti-spoof pixels with a color filter, the method may be used in conjunction with the optical fingerprint sensor of FIG. 4 or 5, in embodiments.

FIG. 7 illustrates a finger being scanned by the optical fingerprint sensor of FIGS. 1A and 1B installed below the screen of a mobile device, according to an embodiment.

DETAILED DESCRIPTION OF THE EMBODIMENTS

Reference throughout this specification to "one example" or "one embodiment" means that a particular feature, structure, or characteristic described in connection with the example is included in at least one example of the present invention. Thus, the appearances of the phrases "in one example" or "in one embodiment" in various places throughout this specification are not necessarily all referring to the same example. Furthermore, the particular features, structures, or characteristics may be combined in any suitable manner in one or more examples.

Spatially relative terms, such as "beneath," "below," "lower," "under," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" or "under" other elements or features would then be oriented "above" the other elements or features. Thus, the terms "below" and "under" may encompass both an orientation of above and below. The device may be otherwise oriented (rotated ninety degrees or at other orientations) and the spatially relative descriptors used herein interpreted accordingly. In addition, it will also be understood that when a layer is referred to as being "between" two layers, it may be the only layer between the two layers, or one or more intervening layers may also be present.

The term semiconductor substrate may refer to substrates formed using semiconductors such as silicon, silicon-germanium, germanium, gallium arsenide, and combinations thereof. The term semiconductor substrate may also refer to a substrate, formed of one or more semiconductors, subjected to previous process steps that form regions and/or junctions in the substrate. A semiconductor substrate may also include various features, such as doped and undoped semiconductors, epitaxial layers of silicon, and other semiconductor structures formed upon the substrate.

Throughout this specification, several terms of art are used. These terms are to take on their ordinary meaning in the art from which they come, unless specifically defined herein or the context of their use would clearly suggest otherwise. It should be noted that element names and symbols may be used interchangeably through this document (e.g., Si vs. silicon); however, both have identical meanings.

Figure 1A:
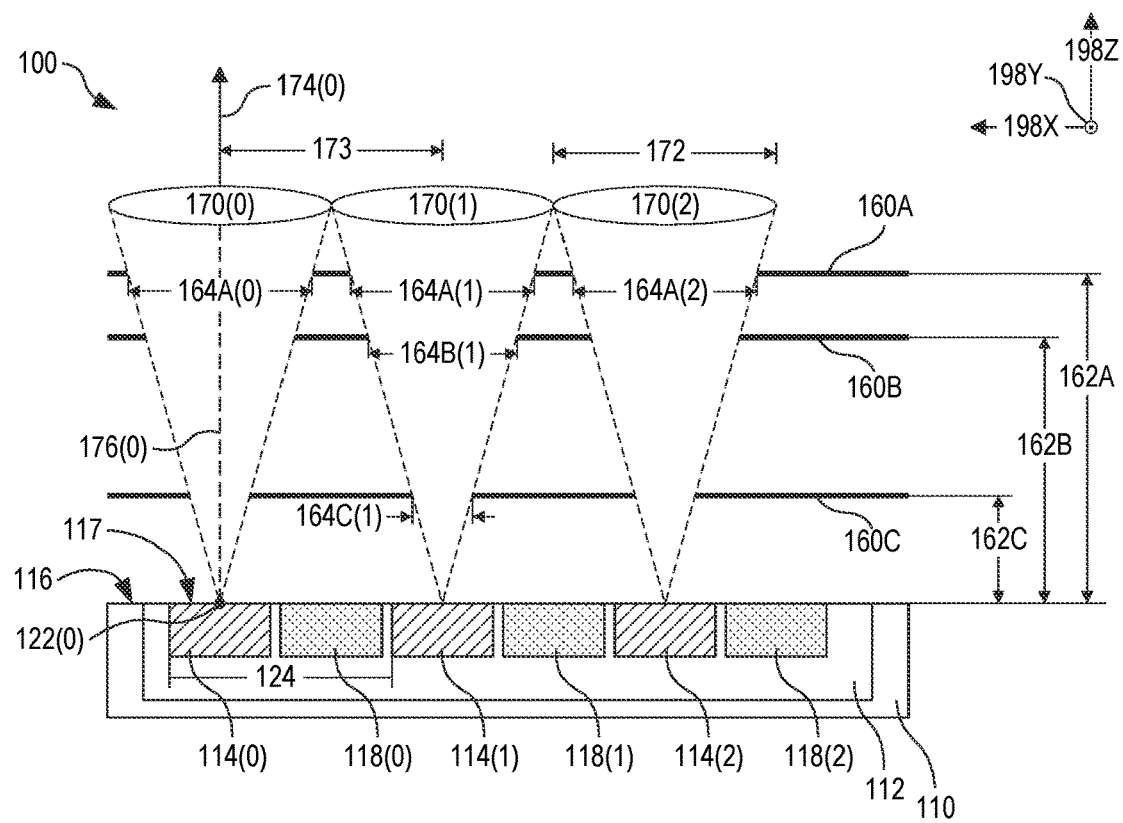
FIGS. 1A and 1B illustrate a cross-sectional side view of an optical fingerprint sensor that detects light with a plurality of second photodiodes to identify spoof fingerprints.
Figure 1B:
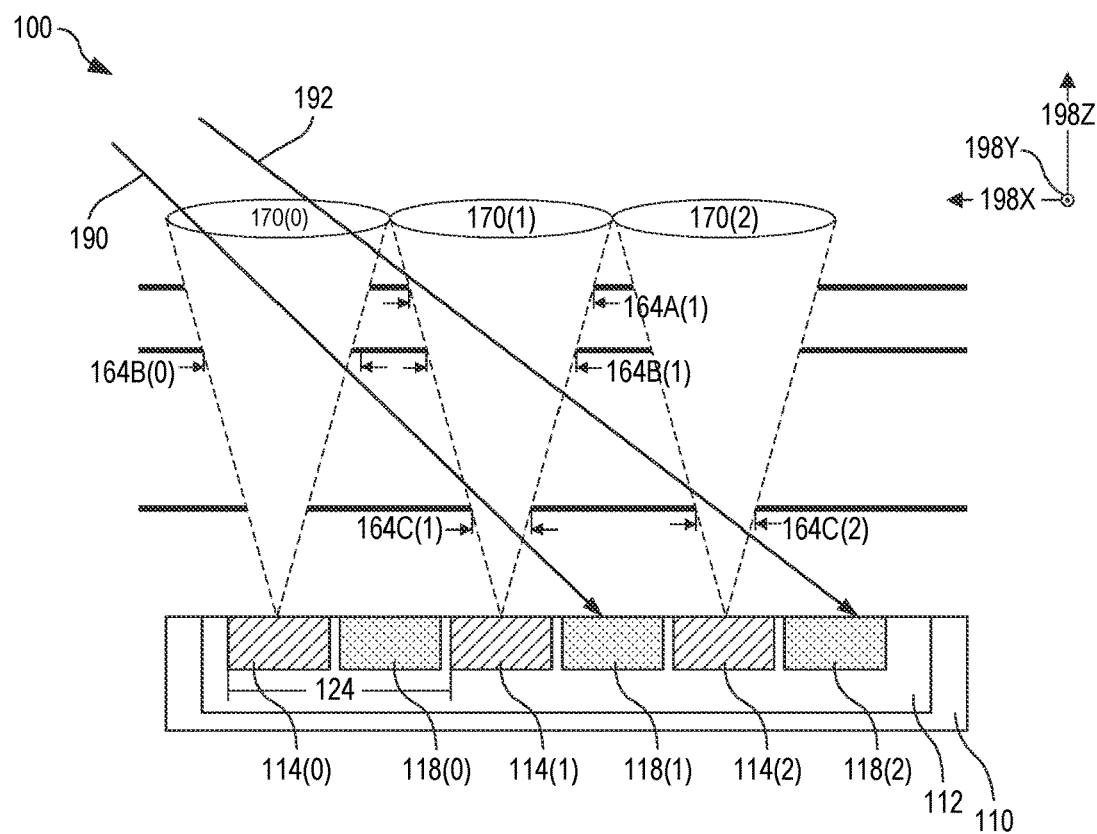

FIGS. 1A and 1B illustrate a cross-sectional side view of an optical fingerprint sensor 100 that detects electromagnetic energy with a plurality of photodiodes 118 to identify spoof fingerprints. The cross section illustrated in FIGS. 1A and 1B is parallel to a plane, hereinafter the x-z plane, formed by orthogonal axes 198X and 198Z, which are each orthogonal to an axis 198Y. A plane, hereinafter the x-y plane, formed by orthogonal axes 198X and 198Y, and planes parallel to the x-y plane are referred to as horizontal planes. Unless otherwise specified, heights of objects herein refer to the object's extent along axis 198Z. Herein, a reference to an axis x, y, or z refers to axes 198X, 198Y, and 198Z respectively. Also, herein, a width refers to an object's extent along the x axis, a depth refers to an object's extent along the y axis, a thickness (of thinness) refers to an object's extent along the z axis, and vertical refers to a direction along the z axis. Also, herein, above refers to a relative position a distance away along the axis 198Z in the positive direction and below refers to a relative position a distance away along the axis 198Z in the negative direction. FIGS. 1A and 1B are best viewed together.

Optical fingerprint sensor 100 includes a plurality of lenses 170, an image sensor 110, and at least one apertured baffle-layer 160. The plurality of lenses 170 includes J lenses, 170($m$=0), 170(1), 170(2) . . . 170(J−1). Each lens 170 has a lens width 172 and the plurality of lenses 172 has a lens pitch 173 along a horizontal direction. In FIGS. 1A and 1B the lens width 172 and lens pitch 173 are equal but the lens width 172 may be smaller than the lens pitch 173 without departing from the scope hereof. The lens 170(0) has a lens axis 174 that is parallel to the axis 198Z. The plurality of lenses 170 is positioned above a light-sensitive surface 116 of the image sensor 110. The image sensor 110 includes a pixel array 112 that includes a plurality of first photodiodes 114 that contains J photodiodes, 114($m$=0), 114(1), 114(2) . . . 114(J−1). The plurality of first photodiodes 114 has a first photodiode pitch 124 that, in an embodiment illustrated in FIGS. 1A and 1B, is equal to the lens pitch 173 in the horizontal direction. A line that connects an optical center of each lens 170 and a center 122 of a light-sensitive surface 117 of each first photodiode 114 forms an optical axis 176 of a plurality of optical axes 176. In an embodiment, each optical axis of the plurality of optical axes 176 is normal to the light sensitive surface 116 and each lens 170 has a lens axis 174 aligned with the optical axis 176 of the respective first photodiode 114. In an embodiment, the optical axis 176($m$) of each lens 170($m$) depends on the horizontal location of the lens 170($m$). In a so-called "fan-out" design, a lens 170($m$) aligned with photodiode 114($m$) near center of the pixel array 112 has optical axis 176($m$) that is substantially normal to the light-sensitive surface 116 but lens 170($n$) aligned with photodiode 114($n$) near the edge of the pixel array 112 has optical axis 176($n$) angled with respect to the surface normal of the light sensitive surface 116. In the embodiment illustrated in FIGS. 1A and 1B, the distance between each lens 170 and the corresponding first photodiode 114 is configured along with the focal length of the lens 170 such that collimated electromagnetic energy incident on the lens 170 from the positive z direction and parallel to the optical axis 176 will be focused to the center 122 of first photodiode 114. The plurality of first photodiodes 114 record light that is reflected from a fingerprint sample that is then used to generate a fingerprint image. In an embodiment, each first photodiode 114 is a sub-array of the pixel array 112 including more than one photodiode.

Each apertured baffle-layer 160 is positioned between the plurality of lenses 170 and the image sensor 110. Each of the at least one apertured baffle-layer 160 is located a respective height 162 above the pixel array 112. The embodiment illustrated in FIGS. 1A and 1B includes three apertured baffle-layers, 160A, 160B, and 160C that are a height 162A, 162B, and 162C, respectively, above the pixel array 112. The optical fingerprint sensor 100 may have more or fewer apertured baffle-layers 160 without departing from the scope hereof. The relative spacing and height of each apertured baffle-layer 160 above the pixel array 112 is for illustrative purposes and is not meant to limit the possible configurations of the at least one apertured baffle-layer 160 within the optical fingerprint sensor 110.

Each apertured baffle-layer 160 has a respective plurality of apertures stops 164 that contains J aperture stops, 164A ($m$=0), 164A(1), 164A(2) . . . A164A(J−1). Each aperture stop 164 is center-aligned with a given first photodiode 114 along the corresponding optical axis 176. For example apertures stops 164A(0), 164A(1), and 164A(2) of apertured baffle-layer 160A are center-aligned with respective optical axes 176(0), 176(1), and 176(2). Some optical axes are not illustrated for clarity of illustration. In the embodiment illustrated in FIGS. 1A and 1B, the aperture stops 164A(1), 164B(1), and 164C(1) are center-aligned with the optical axis 176(1), not shown for clarity of illustration.

The pixel array 112 includes the plurality of second photodiodes 118 that contains k photodiodes, 118($m$=0), 118(1), 118(2) . . . 118($k$−1). The plurality of second photodiodes 118 is intercalated with the plurality of first photodiodes 114 such that a second photodiode 118($m$) is between first photodiode 114($m$) and first photodiode 114 ($m$+1) in the horizontal direction. Each second photodiode 118 is configured to detect electromagnetic energy having passed through lens Lm and at least one aperture stop $A_{x \neq m}$ not aligned with Lm along the optical axis $O_m$. This is illustrated in FIG. 1B. A ray of electromagnetic energy 190 passes through lens 170($m$=0) and through aperture stop 164C(m=1). Another ray of electromagnetic energy 192 passes through lens 170($m$=0) and through aperture stops 164A(m=1), A164B(m=1) and 164C(m=2). Both rays of electromagnetic energy 190 and 192 are detected by a second photodiode (118(1) and 118(2), respectively) of the plurality of second photodiodes 118. In an embodiment, each second photodiode 118 is a sub-array of the pixel array 112 including more than one photodiode Electromagnetic energy detected by the plurality of second photodiodes 118 enters the optical fingerprint sensor 100 with a large angle of incidence with respect to the optical axis 176. This large-angle electromagnetic energy is quantified here as incoming electromagnetic energy incident on lens 170($m$) with an angle of incidence divergent from the optical axis 176($m$) by greater than five degrees.

In an embodiment, each of the apertured baffle-layer 160 is opaque to visible electromagnetic energy, for example, light incident on the apertured baffle-layer 160 between adjacent apertures stops of the plurality of aperture stops 164. This reduces the number of paths that incoming electromagnetic energy may take and still be incident on the plurality of first photodiodes 114. As discussed earlier, each apertured baffle-layer 160 helps the optical fingerprint sensor 100 record an image of a fingerprint sample.

Figure 2:
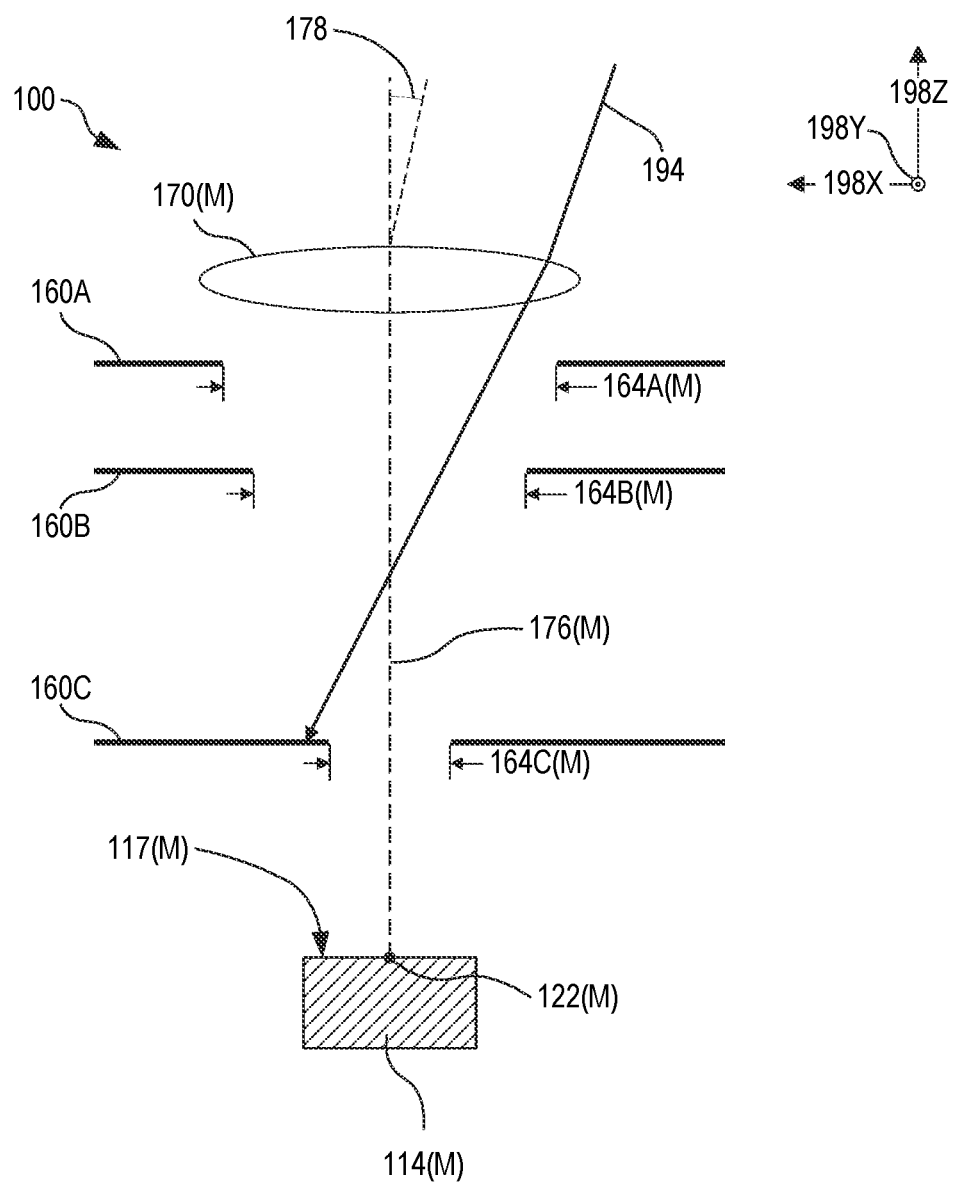
FIG. 2 is a schematic cross-sectional view of part of the optical fingerprint sensor of FIGS. 1A and 1B, according to an embodiment.

FIG. 2 is a schematic cross-sectional view of part of optical fingerprint sensor 100 including the first photodiode 114($m$), center 122($m$) of the light-sensitive surface 117, along with lens 170(*m*), optical axis 176(*m*), and sections of the least one apertured baffle-layer 160A, 160B, and 160C that include apertures stops 164A(m), 164B(m), and 164AC(m) respectively.

Each of the aperture stops 164A(m), 164B(m), and 164C(m) illustrated in FIG. 2 is center-aligned with the optical axis 176(M). Each aperture stop 164A(m), 164B(m), and 164C(m) has a width such that they collectively transmit electromagnetic energy incident on the lens 170(*m*) that falls within an acceptance angle 178, which is measured as an angular divergence from the optical axis 176(*m*) of rays incident on the lens 170(*m*). A ray of electromagnetic energy 194 with incident angle larger than the acceptance angle 178 is prevented from striking the first photodiode 114(M) when it is incident on the apertured baffle-layer 160C. In an embodiment, each aperture stop of the plurality of aperture stops 164 on each of the at least one apertured baffle-layer is circular in a horizontal plane.

Figure 3:
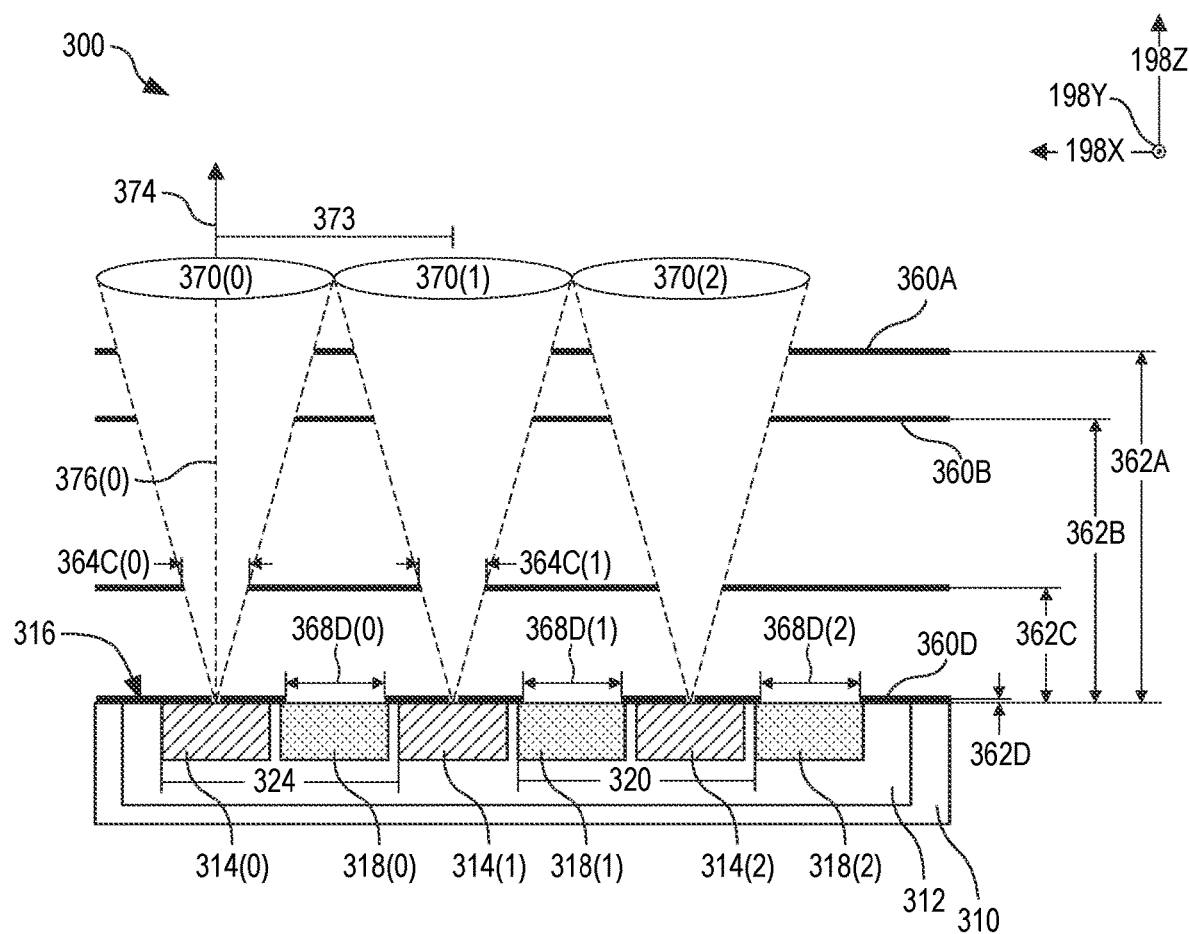
FIG. 3 is a schematic cross-sectional view of the optical fingerprint sensor of FIGS. 1A and 1B with a fourth apertured baffle-layer that is less than ten microns above the light-sensitive surface of the image sensor, according to an embodiment.

FIG. 3 is a schematic cross-sectional view of an optical fingerprint sensor 300 that is an example of the optical fingerprint sensor 100 of FIG. 1. In the embodiment illustrated in FIG. 3, at least one apertured baffle-layer 360 includes a fourth apertured baffle-layer 360D having a distance 362D less than ten microns above a light-sensitive surface 316 of an image sensor 310. The apertured baffle-layer 360D has a plurality of aperture stops 364 with J apertures stops 364D(0), 364D(1) . . . 364D(J−1) (not indicated) like those illustrated in FIGS. 1A, 1B, and 2. Apertured baffle-layer 360D further includes a plurality of second aperture stops 368 with K aperture stops 368D(0), 368D(1) . . . 368D(K−1), there being one second aperture stop 368 for each second photodiode 318 of a plurality of second photodiodes 318. Each second aperture stop 368 is center-aligned with a center of a light-sensitive surface (not indicated) of a respective second photodiode 318 in a direction parallel to an optical axis 376, as illustrated in FIG. 3. The plurality of second aperture stops 368 on apertured baffle-layer 360D permit electromagnetic energy to be detected by the plurality of second photodiodes 318 while further restricting the paths available that allow electromagnetic energy to be detected by a plurality of first photodiodes 314. The distance 362D may be varied depending on the fabrication processes used and the tolerances associated with those processes.

In an embodiment, the number of first photodiodes 314 is equal to the number of second photodiodes 318. Accordingly, the number of lenses 370, the number of apertures stops on each apertured baffle-layer 360, and the number of second aperture stops 368 are also equal, both to each other and to the number of first photodiodes 314 and to the number of second photodiodes 318. More succinctly, the counters above, J and K, are equal. This need not be the case, however. The relative quantity of first photodiodes 314 and second photodiodes 318 may vary without departing from the scope hereof.

FIG. 3 illustrates an embodiment where the plurality of second photodiodes 318 has a second photodiode pitch 320 that is equal to the first photodiode pitch 324 and to the lens pitch 373 in the horizontal direction. The first photodiode pitch 324 and the second photodiode pitch 320 need not be equal, however, and embodiments may have larger or small second photodiode pitch 320 relative to first photodiode pitch 324 without departing from the scope hereof. In an embodiment, each second photodiode 318 is wider than each first photodiode 314 and/or has a larger depth. The relative width and depth of each first photodiode 314 to each second photodiode 318 may vary without departing from the scope hereof.

Figure 4:
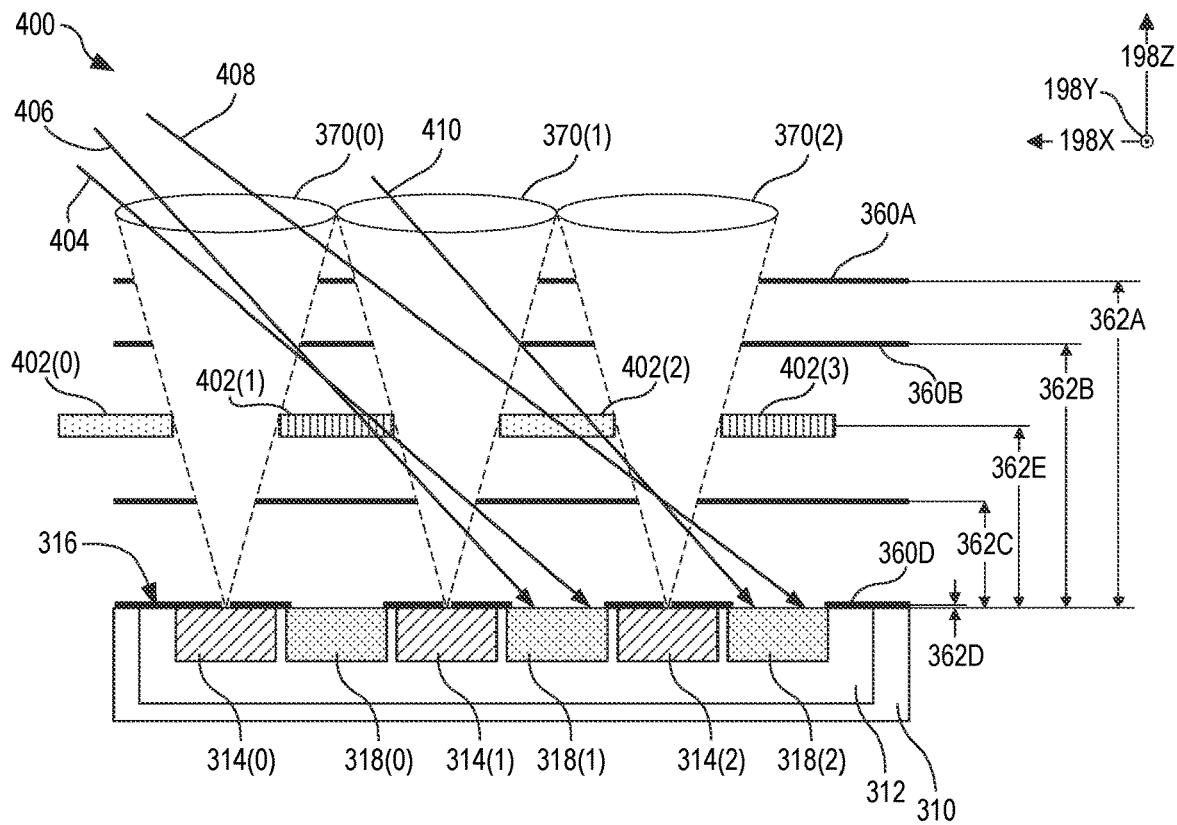
FIG. 4 is a schematic cross-sectional view of the optical fingerprint sensor of FIG. 3 with a color filter layer between two aperture baffle-layers, according to an embodiment.

FIG. 4 is a schematic cross-sectional view of an optical fingerprint sensor 400 that is an example of the optical fingerprint sensor 300 of FIG. 3. Common reference numbers indicate the same feature in both figures. In the embodiment illustrated in FIG. 4, apertured baffle-layer 360 forms an optical stack that includes colored filter layer 402. As described above, each apertured baffle-layer 360 has a plurality of aperture stops like those illustrated in FIGS. 1A, 1B, 2, and 3. For clarity, aperture stops are not indicated in FIG. 4. Aperture baffle layer 360D also includes a plurality of second aperture stops that are center-aligned with a center of a light-sensitive surface (not indicated) of a respective second photodiode 318 in a direction parallel to an optical axis 376, as illustrated in FIG. 3. The plurality of second aperture stops on apertured baffle-layer 360D permit electromagnetic energy to be detected by the plurality of second photodiodes 318 while further restricting the paths available that allow electromagnetic energy to be detected by a plurality of first photodiodes 314. As such, the distance 362D may be varied slightly depending on the fabrication processes used and the tolerances associated with those processes.

Colored filter layer 402 is shown in FIG. 4 at a height 362E above the pixel array 312. In embodiments, colored filter layer 402 may be located at other heights such as between apertured baffle-layers 360A and 360B. In general, colored filter layer 402 is formed in the optical stack of aperture baffle-layers 360 at locations that will be in the light-path of only the larger-angle light which is received by second photodiodes 318. Using color filters in primary imaging optics for first photodiodes 314 may deteriorate and complicate the primary image that is used for fingerprint matching. In the embodiment of FIG. 4, color filters are positioned within the optical stack in such a way that they filter electromagnetic energy that strikes second photodiodes 318 and do not disturb the light path for the primary fingerprint image detected with first photodiodes 314.

Filter layers of different spectral transmission may be used to measure the spectra of electromagnetic energy 404, 406, 408 and 410. For example, filters 402(0) and 402(2) transmit blue bands (e.g. wavelength range of 430 nm-490 nm). Filters 402(1) and 402(3) transmit green bands (e.g. wavelength range of 490 nm-570 nm) or neutral filters may also be used. A pattern of color filters across the pixel array provides additional information for anti-spoof detection. As shown in FIG. 4, electromagnetic energy 404 passes through a lens 370(0) and color filter 402(1) before striking second photodiode 318(1). Electromagnetic energy 408 also passes through lens 370(0) but, due to it's angle of incidence, it passes through color filter 402(2) before striking second photodiode 318(2).

Figure 5:
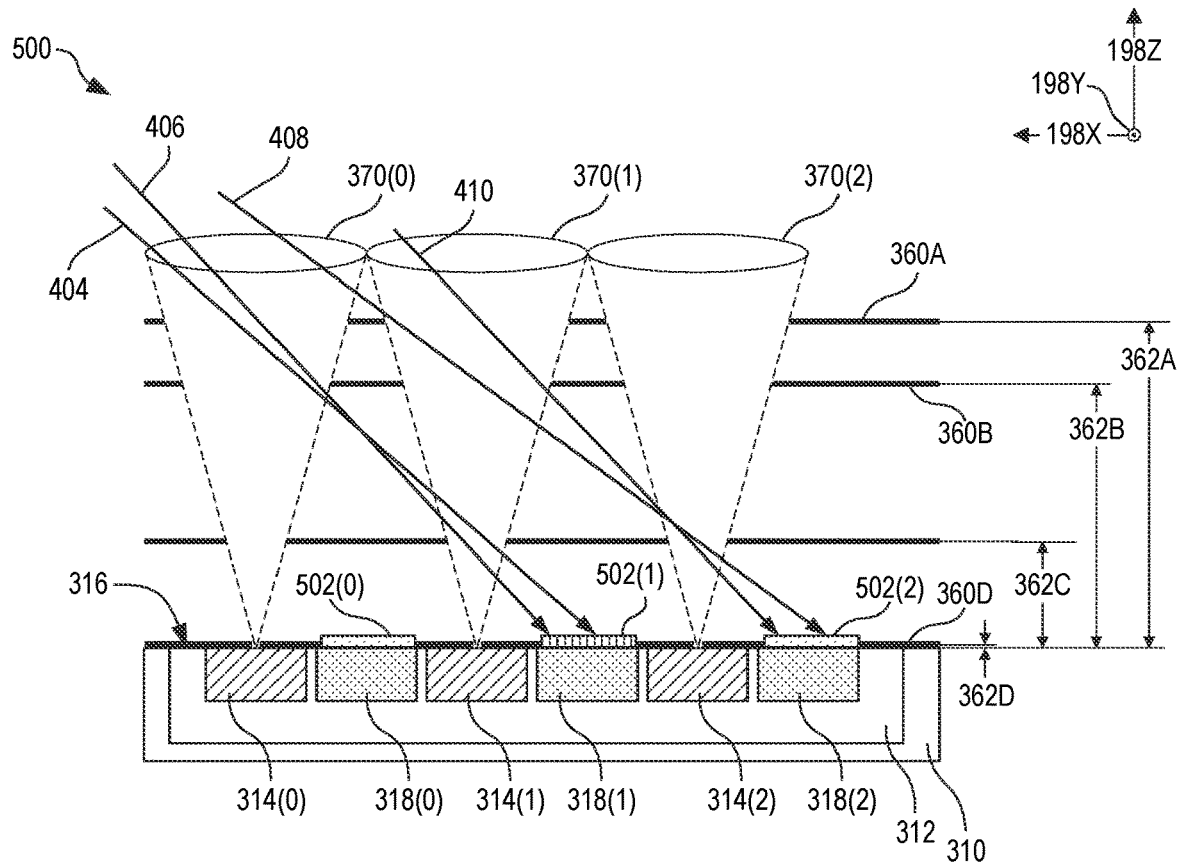
FIG. 5 is a schematic cross-sectional view of the optical fingerprint sensor of FIG. 3 with a color filter layer that is less than 10 microns above the light sensitive surface of the optical fingerprint sensor, according to an embodiment.

FIG. 5 is a schematic cross-sectional view of an optical fingerprint sensor 500 that is an example of the fingerprint sensors 300 and 400 of FIGS. 3 and 4. Common reference numbers indicate the same feature in all three figures. In the embodiment illustrated in FIG. 5, colored filter layer 502 is located at approximately the same height 362D above the surface of pixel array 312 as aperture baffle layer 360D. As described above for FIG. 4, electromagnetic energy 404, 406, 408 and 410 passes through color filter layer 502 before striking one of second photodiodes 318. As shown in FIG. 5, electromagnetic energy 404 passes through a lens 370(0) and color filter 502(2) before striking second photodiode 318(1). Electromagnetic energy 408 also passes through lens 370(0) but, due to it's angle of incidence, it passes through color filter 502(2) before striking second photodiode 318(2).

FIG. 6 is a flowchart illustrating a method 600 for detecting spoof fingerprints using a plurality of anti-spoof pixels with color filtering. Method 600 may be implemented by any one of the optical fingerprint sensors 400 or 500 of FIGS. 4 and 5. Method 600 includes blocks 610, 660, and 670. In embodiments, method 600 also includes at least one of blocks 602, 604, 630, 632, 634, 636, and 672.

In block 610, large-angle light incident on a plurality of anti-spoof photodiodes of a pixel array after passing through a color filter layer is detected. Large-angle light is incoming electromagnetic energy with incident angle greater than five degrees from the optical axis of the anti-spoof photodiode. The plurality of anti-spoof photodiodes is interleaved with a plurality of imaging photodiodes such that each anti-spoof photodiode of the plurality of anti-spoof photodiodes is between adjacent imaging photodiodes of the plurality of imaging photodiodes. A color filter layer is located at a distance above the anti-spoof photodiodes so that only large-angle light passes through the color filter. In an example of block 610, rays of electromagnetic energy 404 and 406 are detected by second photodiode 318(1) after passing through color filter 402(1) and electromagnetic energy 408 and 410 are detected by second photodiode 318(2) after passing through color filter 402(2).

In block 660, an angular distribution of electromagnetic energy is determined at least in part on the detected large-angle light. In one example of block 660, the relative response of different spectral ranges provides additional information for determining an angular distribution of electromagnetic energy.

In block 670, spoof fingerprints are detected based at least in part on the angular distribution of electromagnetic energy. Further, the spectral information provided as electromagnetic energy passes through colored filter layer 402, 502 may be correlated to features in the primary fingerprint image to improve anti-spoof detection.

In certain embodiments, the method 600 includes one or more additional blocks of the flowchart in FIG. 6. In block 602, a fingerprint sample is illuminated with electromagnetic energy from a display and the plurality of anti-spoofing photodiodes and the plurality of imaging photodiodes are positioned underneath a glass of a display. One example of a device implementing block 602 is illustrated in FIG. 7, described below. In block 604, the fingerprint sample is illuminated with a non-uniform pattern of illumination, which aids in determining the angular distribution of electromagnetic energy in block 660.

In block 630, small-angle light incident on the plurality imaging photodiodes of the pixel array is detected, small-angle light being incoming electromagnetic energy with incident angle less than five degrees from the optical axis of the anti-spoof photodiode. In an example of block 630, electromagnetic energy is transmitted through lens 170(0) and then passes through aperture stops 164A(0), 164B(0), and 164C(0) before being detected by first photodiode 114(0).

Block 630 may include block 632, in which the angular distribution of electromagnetic energy is determined based at least in part on the small-angle light detected. In one example of block 632, an angular distribution of electromagnetic energy is determined at least in part based on (i) electromagnetic energy propagating through lens 170(0) and then passes through aperture stops 164A(0), 164B(0), and 164C(0) before being detected by first photodiode 114(0) and (ii) electromagnetic energy 190 and 192 that is detected by second photodiodes (118(1) and 118(2), respectively) of the plurality of second photodiodes 118 of FIG. 1B.

In block 634, large-angle light is prevented from striking the plurality of imaging photodiodes using at least one apertured baffle-layer. In an example of block 634, the ray of electromagnetic energy 194 is prevented from reaching the first photodiode 114(M) by the apertured baffle-layer 160A, FIG. 2.

In block 636, small-angle light is directed with a plurality of lenses, in which a lens directs small-angle light toward one imaging photodiode of the plurality of imaging photodiodes. In an example of block 636, electromagnetic energy is transmitted through lens 170(0) and then passes through aperture stops 164A(0), 164B(0), and 164C(0) before being detected by first photodiode 114(0), FIG. 1A.

In block 672, at least one anti-spoof algorithm is applied to the detected large-angle light. In an embodiment, the at least one anti-spoof algorithm includes machine learning algorithms. An anti-spoof algorithm may incorporate spectral information from color filter layers 402 or 502.

FIG. 7 illustrates the optical fingerprint sensor 100 installed in a mobile device 702 below a display including a cover glass 704 and a light-emitting layer 706. A fingerprint sample 708 is being scanned by the optical fingerprint sensor 100, which is shown in more detail in an inset to the right. In an embodiment, the mobile device 702 may be a mobile phone, tablet, or other electronic device with a display. In an embodiment, the light-emitting layer 706 illuminates the fingerprint sample 708 with a non-uniform pattern of illumination including one or more of (i) alternating light and dark lines, (ii) square spots of illumination, and (iii) illuminating only portions of the fingerprint sample for example only one edge of the fingerprint sample. The non-uniform pattern of illumination aids in determining the angular distribution emitted by the fingerprint sample 708.

Electronic device 702 includes at least one processor 752 communicatively coupled to display 702, optical fingerprint sensor 100/300, and memory 754 storing an application 756 (e.g., software/firmware) that include machine readable instructions that, when executed by processor 752, control display 702 and optical fingerprint sensor 100/300 to capture an image of a finger 708 touched to cover lens 704 proximate optical fingerprint sensor 100/300 to detect when fingerprint sample 708 is a spoof fingerprint.

Although FIG. 7 is depicted with optical fingerprint sensor 100, any of optical fingerprint sensors 200, 300, 400 or 500 may be installed similarly.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

COMBINATION OF FEATURES (A1) In a first aspect, an optical fingerprint sensor with spoof detection includes a plurality of lenses $Lm=0, L1, \ldots LJ-1$ with a lens pitch along a horizontal direction that is orthogonal to a lens axis of lens L0, each lens having a width; an image sensor including a pixel array that includes a plurality of first photodiodes $Im=0, I1, \ldots IJ-1$ with a first photodiode pitch that is equal to the lens pitch in the horizontal direction, a line between a center of a light-sensitive surface of each first photodiode Im and an optical center of each lens Lm forms an optical axis Om of a plurality of optical axes Om=0, O1, . . . OJ−1; at least one apertured baffle-layer positioned between the image sensor and the plurality of lenses, each of the at least one apertured baffle-layer located at a respective height zk above the pixel array and each having a respective plurality of aperture stops Am=0, A1, . . . AJ−1, each aperture stop Am being center-aligned with the optical axis Om; and a plurality of second photodiodes Sm=0, S1, SK−1 that is included in the pixel array, the plurality of second photodiodes is intercalated with the plurality of first photodiodes such that a second photodiode Sm is between first photodiode Im and first photodiode Im+1 in the horizontal direction; and a color filter layer between the image sensor and the plurality of lenses, said color filter layer includes a plurality of color filters positioned in the path of electromagnetic energy detected by one of the plurality of second photodiodes but not one of the plurality of first photodiodes, wherein each second photodiode is configured to detect electromagnetic energy having passed through lens Lm, a color filter, and at least one aperture stop Ax≠m not aligned with Lm along optical axis Om.

(A2) In an embodiment of A1, the color filter layer is between two apertured baffle-layers.

(A3) In an embodiment of either A1 or A2, the color filter layer is approximately at a distance $z_k$ equal less than ten microns from the image sensitive surface of the image sensor.

(A4) In an embodiment of any of A1 through A3, between adjacent aperture stops of the plurality of apertures stops, each of the at least one apertured baffle-layer being opaque to visible electromagnetic energy.

(A5) In an embodiment of any of A1 through A4, the at least one aperture stop $A_m$ aligned along the optical axis $O_m$ having respective widths such that at least one aperture stops $A_m$ collectively transmit electromagnetic energy that falls within an acceptance angle, the acceptance angle measured as an angular divergence from the optical axis $O_m$ of rays incident on the center of the light-sensitive surface of the first photodiode $I_m$.

(A6) In an embodiment of any of A1 through A5, each aperture stop of the plurality of aperture stops on each of the at least one apertured baffle-layer being circular in the horizontal plane.

(A7) In an embodiment of any of A1 through A6, one of the at least one apertured baffle-layer having a distance $z_k$ equal less than ten microns and having a plurality of second aperture stops $SA_{m=0}$, $SA_1$, . . . $SA_{K-1}$ having a second aperture stop $SA_m$ for each second photodiode $S_m$, each second aperture stop $SA_m$ center-aligned with a center of a light-sensitive surface of each second photodiode $S_m$ in a direction parallel to the optical axis $O_m$.

(A8) In an embodiment of any of A1 through A7, the at least one apertured baffle-layer includes four baffle-layers.

(A9) In an embodiment of any of A1 through A8, the number first photodiodes, J, being equal to the number of second photodiodes, K.

(A10) In an embodiment of any of A1 through A9, the plurality of second photodiodes having a second photodiode pitch that is equal to the lens pitch in the horizontal direction.

(B1) In a second aspect, a method for detecting spoof fingerprints detected using an optical fingerprint sensor includes detecting large-angle light incident on a plurality of anti-spoof photodiodes of a pixel array after it passes through a color filter, large-angle light being electromagnetic energy with incident angle greater than five degrees from an optical axis of each anti-spoof photodiode of the plurality of anti-spoof photodiodes; wherein the plurality of anti-spoof photodiodes is interleaved with a plurality of imaging photodiodes such that each anti-spoof photodiode of the plurality of anti-spoof photodiodes is between adjacent imaging photodiodes of the plurality of imaging photodiodes; determining an angular distribution of electromagnetic energy based at least in part on the detected large-angle light; and detecting spoof fingerprints based at least in part on the angular distribution and spectral information of electromagnetic energy.

(B2) In an embodiment of B1, the plurality of anti-spoof photodiodes and the plurality of imaging photodiodes being formed in a single pixel array.

(B3) In an embodiment of either B1 or B2, the method further includes detecting small-angle light incident on the plurality of imaging photodiodes of the pixel array, small-angle light being electromagnetic energy with incoming angle less than five degrees from an optical axis of each imaging photodiode of the plurality of imaging photodiodes.

(B4) In an embodiment of any of B1 through B3, the step of determining further includes determining the angular distribution of electromagnetic energy based at least in part on the small-angle light detected.

(B5) In an embodiment of any of B1 through B4, the method further includes preventing larger-angle light from striking the plurality of imaging photodiodes with a plurality of apertured baffle-layers.

(B6) In an embodiment of any of B1 through B5, the method further includes directing small-angle light with a plurality of lenses, each lens directing small-angle light toward one imaging photodiode of the plurality of imaging photodiodes.

(B7) In an embodiment of any of B1 through B6, the method further includes illuminating a fingerprint sample with electromagnetic energy from a display, the plurality of anti-spoofing photodiodes and the plurality of imaging photodiodes positioned underneath a glass of the display.

(B8) In an embodiment of any of B1 through B7, the method further includes illuminating the fingerprint sample with a non-uniform pattern of illumination.

(B9) In an embodiment of any of B1 through B8, the method further includes applying at least one anti-spoof algorithm to the detection of large-angle light and associated spectral information.

(B10) In an embodiment of any of B1 through B9, he at least one anti-spoof algorithm includes one or more machine learning algorithms.

What is claimed is:
1. An optical fingerprint sensor with spoof detection, comprising:
a plurality of lenses $L_{m=0}$, $L_1$, . . . $L_{J-1}$ with a lens pitch along a horizontal direction that is orthogonal to a lens axis of lens $L_0$, each lens having a width;
an image sensor including a pixel array that includes a plurality of first photodiodes $I_{m=0}$, $I_1$, . . . $I_{J-1}$ with a first photodiode pitch that is equal to the lens pitch in the horizontal direction, a line between a center of a light-sensitive surface of each first photodiode $I_m$ and an optical center of each lens Lm forms an optical axis $O_m$ of a plurality of optical axes $O_{m=0}$, O1, . . . $O_{J-1}$;
at least one apertured baffle-layer positioned between the image sensor and the plurality of lenses, each of the at least one apertured baffle-layer located at a respective height $z_k$ above the pixel array and each having a respective plurality of aperture stops $A_{m=0}, A1, \ldots A_{J-1}$, each aperture stop $A_m$ being center-aligned with the optical axis $O_m$; and a plurality of second photodiodes $S_{m=0}, S1, \ldots S_{K-1}$ that is included in the pixel array, the plurality of second photodiodes is intercalated with the plurality of first photodiodes such that a second photodiode $S_m$ is between first photodiode $I_m$ and first photodiode $I_{m+1}$ in the horizontal direction; and a color filter layer between the image sensor and the plurality of lenses, said color filter layer comprising a plurality of color filters positioned in the path of electromagnetic energy detected by one of the plurality of second photodiodes but not one of the plurality of first photodiodes, wherein each second photodiode is configured to detect electromagnetic energy having passed through lens $L_m$, a color filter, and at least one aperture stop $A_{x \neq m}$ not aligned with $L_m$ along optical axis $O_m$.

2. The optical fingerprint sensor of claim 1, wherein the color filter layer is between two apertured baffle-layers.

3. The optical fingerprint sensor of claim 1, wherein the color filter layer is approximately at a distance $z_k$ equal less than ten microns from the image sensitive surface of the image sensor.

4. The optical fingerprint sensor of claim 1, between adjacent aperture stops of the plurality of apertures stops, each of the at least one apertured baffle-layer being opaque to visible electromagnetic energy.

5. The optical fingerprint sensor of claim 4, the at least one aperture stop $A_m$ aligned along the optical axis $O_m$ having respective widths such that at least one aperture stops $A_m$ collectively transmit electromagnetic energy that falls within an acceptance angle, the acceptance angle measured as an angular divergence from the optical axis $O_m$ of rays incident on the center of the light-sensitive surface of the first photodiode $I_m$.

6. The optical fingerprint sensor of claim 1, each aperture stop of the plurality of aperture stops on each of the at least one apertured baffle-layer being circular in the horizontal plane.

7. The optical fingerprint sensor of claim 1, one of the at least one apertured baffle-layer having a distance $z_k$ equal less than ten microns and having a plurality of second aperture stops $SA_{m=0}, SA_1, \ldots SA_{K-1}$ having a second aperture stop $SA_m$ for each second photodiode $S_m$, each second aperture stop $SA_m$ center-aligned with a center of a light-sensitive surface of each second photodiode $S_m$ in a direction parallel to the optical axis $O_m$.

8. The optical fingerprint sensor of claim 1, the at least one apertured baffle-layer comprising four baffle-layers.

9. The optical fingerprint sensor of claim 1, the number first photodiodes, J, being equal to the number of second photodiodes, K.

10. The optical fingerprint sensor of claim 1, the plurality of second photodiodes having a second photodiode pitch that is equal to the lens pitch in the horizontal direction.

11. A method for detecting spoof fingerprints detected using an optical fingerprint sensor, comprising:

detecting large-angle light incident on a plurality of anti-spoof photodiodes of a pixel array after it passes through a color filter, large-angle light being electromagnetic energy with incident angle greater than five degrees from an optical axis of each anti-spoof photodiode of the plurality of anti-spoof photodiodes;

wherein the plurality of anti-spoof photodiodes is interleaved with a plurality of imaging photodiodes such that each anti-spoof photodiode of the plurality of anti-spoof photodiodes is between adjacent imaging photodiodes of the plurality of imaging photodiodes;

determining an angular distribution of electromagnetic energy based at least in part on the detected large-angle light; and detecting spoof fingerprints based at least in part on the angular distribution and spectral information of electromagnetic energy.

12. The method of claim 11, the plurality of anti-spoof photodiodes and the plurality of imaging photodiodes being formed in a single pixel array.

13. The method of claim 11, further comprising detecting small-angle light incident on the plurality of imaging photodiodes of the pixel array, small-angle light being electromagnetic energy with incoming angle less than five degrees from an optical axis of each imaging photodiode of the plurality of imaging photodiodes.

14. The method of claim 13, the step of determining further comprising determining the angular distribution of electromagnetic energy based at least in part on the small-angle light detected.

15. The method of claim 11, further comprising preventing larger-angle light from striking the plurality of imaging photodiodes with a plurality of apertured baffle-layers.

16. The method of claim 11, further comprising directing small-angle light with a plurality of lenses, each lens directing small-angle light toward one imaging photodiode of the plurality of imaging photodiodes.

17. The method of claim 11, further comprising illuminating a fingerprint sample with electromagnetic energy from a display, the plurality of anti-spoofing photodiodes and the plurality of imaging photodiodes positioned underneath a glass of the display.

18. The method of claim 11, further comprising illuminating the fingerprint sample with a non-uniform pattern of illumination.

19. The method of claim 11, further comprising applying at least one anti-spoof algorithm to the detection of large-angle light and associated spectral information.

20. The method of claim 19, the at least one anti-spoof algorithm comprising one or more machine learning algorithms.

* * * * *